United States Patent [19]
Kim

[11] Patent Number: 6,114,979
[45] Date of Patent: Sep. 5, 2000

[54] (N) BIT (M) TERNARY CODING CIRCUIT

[75] Inventor: Yoon Hak Kim, Seoul, Rep. of Korea

[73] Assignee: LG Semicon Co., Ltd., Cheongju, Rep. of Korea

[21] Appl. No.: 09/010,487

[22] Filed: Jan. 21, 1998

[30] Foreign Application Priority Data

Jan. 25, 1997 [KR] Rep. of Korea .................. 97 2176

[51] Int. Cl.⁷ ............................................... H03M 5/18
[52] U.S. Cl. ........................................................ 341/57
[58] Field of Search ........................ 341/57, 58; 375/286, 375/287; 360/40

[56] References Cited

U.S. PATENT DOCUMENTS

| | | | |
|---|---|---|---|
| 4,805,190 | 2/1989 | Jaffre et al. | 341/57 |
| 5,367,535 | 11/1994 | Scholz | 341/57 |
| 5,525,983 | 6/1996 | Patel et al. | 341/57 |
| 5,544,323 | 8/1996 | Heaton et al. | 395/200.14 |

OTHER PUBLICATIONS

"MAC Parameters, Physical Layer, Medium Attachment Units and Repeater for 100 Mb/s Operation;" Supplement to ANSI/IEEE Std. 802.3, 1993 Edition, Document #802.3u/D5.3.

*Primary Examiner*—Brian Young
*Attorney, Agent, or Firm*—Fleshner & Kim

[57] ABSTRACT

A coding circuit of the present invention converts n-bit binary data word at a prescribed clock cycle (t) into to an m-trit ternary code word, where n and m are integers and $n \geq m$. The coding circuit includes an (x) number of storage elements or latches and a (y) number of coders, each storage element or latch receiving (m÷x) bits of the binary data word at a clock cycle of (t÷x). After a prescribed delay period, a corresponding storage element or latch outputs the sampled bits to a corresponding coder at an increasing or decreasing edge of the clock signal. Each coder codes the sampled bits to (m÷y) ternary code. The each of the coders outputs (m÷y) ternary code onto a corresponding signal line of a bus. Hence, the coding circuit outputs m-trit ternary code word onto the bus. An exemplary coding circuit is illustrated where n=8, m=6, t=25 MHz, x=2 and y=2, and D flip-flops are used for the storage elements and latches.

12 Claims, 4 Drawing Sheets

100 BASE-T4 8B6T code table

| data octet | 6T code group | data octet | 6T code group | data octet | 6T code group | data octet | 6T code group |
|---|---|---|---|---|---|---|---|
| 00 | +-00+- | 20 | 00-++- | 40 | +0+00- | 60 | 0-0++0 |
| 01 | 0+-+-0 | 21 | --+00+ | 41 | ++00-0 | 61 | 00-+0+ |
| 02 | +-0+-0 | 22 | ++-0+- | 42 | +0+0-0 | 62 | 0-0+0+ |
| 03 | -0++-0 | 23 | ++-0-+ | 43 | 0++0-0 | 63 | -00+0+ |
| 04 | -0+0+- | 24 | 00+0-+ | 44 | 0++00- | 64 | -00++0 |
| 05 | 0+--0+ | 25 | 00+0+- | 45 | ++0-00 | 65 | 00-0++ |
| 06 | +-0-0+ | 26 | 00-00+ | 46 | +0+-00 | 66 | 0-00++ |
| 07 | -0+-0+ | 27 | --+++- | 47 | 0++-00 | 67 | -000++ |
| 08 | -+00+- | 28 | -0-++0 | 48 | 000+00 | 68 | -+-++0 |
| 09 | 0-++-0 | 29 | --0+0+ | 49 | 000-++ | 69 | --++0+ |
| 0A | -+0+-0 | 2A | -0-+0+ | 4A | 000+-+ | 6A | -+-+0+ |
| 0B | +0-+-0 | 2B | 0--+-+ | 4B | 000++- | 6B | +--+0+ |
| 0C | +0-0+- | 2C | 0--++0 | 4C | 000-+0 | 6C | +--++0 |
| 0D | 0-+-0+ | 2D | --00++ | 4D | 000-0+ | 6D | --+0++ |
| 0E | -+0-0+ | 2E | -0-0++ | 4E | 000+-0 | 6E | -+-0++ |
| 0F | +0--0+ | 2F | 0--0++ | 4F | 000+0- | 6F | +--0++ |
| 10 | +0+--0 | 30 | +-00-+ | 50 | +0+--+ | 70 | -++000 |
| 11 | ++0-0- | 31 | 0+--+0 | 51 | ++0-+- | 71 | +-+000 |
| 12 | +0+-0- | 32 | +-0-+0 | 52 | +0+-+- | 72 | ++-000 |
| 13 | 0++-0- | 33 | -0+-+0 | 53 | 0++-+- | 73 | 00+000 |
| 14 | 0++--0 | 34 | -0+0-+ | 54 | 0++--+ | 74 | -0+000 |
| 15 | ++00-- | 35 | 0+-+0- | 55 | ++0+-- | 75 | 0-+000 |
| 16 | +0+0-- | 36 | +-0+0- | 56 | +0++-- | 76 | +0-000 |
| 17 | 0++0-- | 37 | -0++0- | 57 | 0+++-- | 77 | 0+-000 |
| 18 | 0+-0+- | 38 | -+00-+ | 58 | +++0-- | 78 | 0--+++ |
| 19 | 0+-0-+ | 39 | 0-+-+0 | 59 | +++-0- | 79 | -0-+++ |
| 1A | 0+-++- | 3A | -+0-+0 | 5A | +++--0 | 7A | --0+++ |
| 1B | 0+-00+ | 3B | +0--+0 | 5B | ++0--0 | 7B | --0++- |
| 1C | 0-+00+ | 3C | +0-0-+ | 5C | ++0--+ | 7C | ++-00- |
| 1D | 0-+++- | 3D | 0-++0- | 5D | ++000- | 7D | 00+00- |
| 1E | 0-+0-+ | 3E | -+0+0- | 5E | --+++0 | 7E | ++---+ |
| 1F | 0-+0+- | 3F | +0-+0- | 5F | 00-++0 | 7F | 00+--+ |

FIG. 3a

100 BASE-T4 8B6T code table (continued)

| data octet | 6T code group | data octet | 6T code group | data octet | 6T code group | data octet | 6T code group |
|---|---|---|---|---|---|---|---|
| 80 | +-+00- | A0 | 0-0++- | C0 | +-+0+- | E0 | +-0++- |
| 81 | ++-0-+ | A1 | 00-+-+ | C1 | ++-+-0 | E1 | 0+-+-+ |
| 82 | +-+0-0 | A2 | 0-0+-+ | C2 | +-++-0 | E2 | +-0+-+ |
| 83 | -++0-0 | A3 | -00+-+ | C3 | -+++-0 | E3 | -00-+ |
| 84 | -++00- | A4 | -00++- | C4 | -++0+- | E4 | -0+++- |
| 85 | ++--00 | A5 | 00--++ | C5 | ++--0+ | E5 | 0+--++ |
| 86 | +-+-00 | A6 | 0-0-++ | C6 | +-+-0+ | E6 | +-0-++ |
| 87 | -++-00 | A7 | -00-++ | C7 | -++-0+ | E7 | -0+-++ |
| 88 | 0+000- | A8 | -+-++- | C8 | 0+00+- | E8 | -+0++- |
| 89 | 00+0-0 | A9 | --++-+ | C9 | 00++-0 | E9 | 0-++-+ |
| 8A | 0+00-0 | AA | -+-+-+ | CA | 0+0+-0 | EA | -+0+-+ |
| 8B | +000-0 | AB | +--+-+ | CB | +00+-0 | EB | +0-+-+ |
| 8C | +0000- | AC | +--++- | CC | +000+- | EC | +0-++- |
| 8D | 00+-00 | AD | --+-++ | CD | 00+-0+ | ED | 0-+-++ |
| 8E | 0+0-00 | AE | -+--++ | CE | 0+0-0+ | EE | -+0-++ |
| 8F | +00-00 | AF | +---++ | CF | +00-0+ | EF | +0--++ |
| 90 | +-+--+ | B0 | 0-000+ | D0 | +-+0-+ | F0 | +-000+ |
| 91 | ++--+- | B1 | 00-0+0 | D1 | ++--+0 | F1 | 0+-0+0 |
| 92 | +-+-+- | B2 | 0-00+0 | D2 | +-+-+0 | F2 | +-00+0 |
| 93 | -++-+- | B3 | -000+0 | D3 | -++-+0 | F3 | -0+0+0 |
| 94 | -++--+ | B4 | -0000+ | D4 | -++0-+ | F4 | -0+00+ |
| 95 | ++-+-- | B5 | 00-+00 | D5 | ++-+0- | F5 | 0+-+00 |
| 96 | +-++-- | B6 | 0-0+00 | D6 | +-++0- | F6 | +-0+00 |
| 97 | -+++-- | B7 | -00+00 | D7 | -+++0- | F7 | -0++00 |
| 98 | 0+0--+ | B8 | -+-00+ | D8 | 0+00-+ | F8 | -+000+ |
| 99 | 00+-+- | B9 | --+0+0 | D9 | 00+-+0 | F9 | 0-+0+0 |
| 9A | 0+0-+- | BA | -+-0+0 | DA | 0+0-+0 | FA | -+00+0 |
| 9B | +00-+- | BB | +--0+0 | DB | +00-+0 | FB | +0-0+0 |
| 9C | +00--+ | BC | +--00+ | DC | +000-+ | FC | +0-00+ |
| 9D | 00++-- | BD | --++00 | DD | 00++0- | FD | 0-++00 |
| 9E | 0+0+-- | BE | -+-+00 | DE | 0+0+0- | FE | -+0+00 |
| 9F | +00+-- | BF | +--+00 | DF | +00+0- | FF | +0-+00 |

FIG. 3b

(N) BIT (M) TERNARY CODING CIRCUIT

BACKGROUND OF THE INVENTION

1. Field of the Invention

The present invention relates to data processing, and more particularly an apparatus and method for transmitting n-bit binary data word as a m-trit ternary code word in a high speed network.

2. Background of the Related Art

In general, a communication line is made of 2 pairs of wires for 10 Mbps (bit per second) in a local area network (LAN). A communication line is made of 4 pairs to transfer data at 100 Mbps to satisfy a 100 BASE-T4 ethernet. The binary data, e.g., 8-bit code word is coded in 100 BASE ethernet for a high speed of 100 Mbps. Accordingly, IEEE (Institute of electrical and electronics engineers, Inc.) Std 802.3 u recommends a standard coding method of transmitting an 8-bit binary data word as a 6-trit ternary code word (8B6T). The 8B6T coding method outputs data of 8-bit binary data word at 25 MHZ provided by MII (medium independent interface) into tx-code vectors as 6 ternary code words or symbols. At this time, the symbol has vector values of +1, 0, and −1. U.S. Pat. Nos. 5,544,323 and 5,525,983 illustrate background art apparatus and method and the disclosures therein are incorporated herein by reference.

FIG. 1 is a basic block diagram for PCS (physical coding sublayer) transfer snowing an 8B6T coding circuit, and illustrates a PCS draft standard of IEEE Std 802.3 u. Data is provided for each nibble, and a 25 MHZ clock signal is provided for each nibble from MII (Medium independent interface) (not shown). For a data transfer rate of 100 Mbps, a current nibble is connected to a previous nibble, which is temporarily stored in a buffer, to form an octet. The octet is then applied to one of the input ports of a multiplexer.

Specific constants, e.g. sosa, sosp, eop1, eop3, eop4, eop4, eop5, bad_code, etc., which are required for data-multiplexing, are inputted into an input port at another input of the multiplexer. The constants, sosa and sosb, represent the start of a packet, and the constants, eop1–eop5, represent the end of the packet. The constant, bad_code, represents an error of the inputted data. The constant, zero_code, is applied to the multiplexer when there is no data input.

When an 8 bit data word is applied to the multiplexer, the multiplexer selects a corresponding data according to the constants, and applies the data to the 8B6T coder 10. The 8B6T coder 10, in sequence, outputs 6T code groups words corresponding to the coded ternary symbols +1, 0, and −1. The 6T code groups or words outputted from the 8B6T coder 10 are loaded in parallel to output hold registers ohr1, ohr3, and ohr4, respectively.

In the instant case, a coding algorithm is designed in HDL (hardware description language) according to the PCS draft standard of IEEE Std 802.3 u, and 1262 gate levels are required to achieve a data transfer rate of 100 Mbps for a 100 BASE-T4 for transmission of 8 bit data words through the 8B6T coder 10. Accordingly, the size of the 8B6T coder becomes enlarged. Further, the transmission of 8 bit data words is divided into the current nibble and the previous nibble so that data is processed by 8 bits at a time and the coding circuit functions unstably.

The above references are incorporated by reference herein where appropriate for appropriate teachings of additional or alternative details, features and/or technical background.

SUMMARY OF THE INVENTION

An object of the present invention is to obviate one or more limitations and disadvantages of the related art.

An other object of the invention is to reduce the number of gate levels.

A further object is to provide a stable operation of the coding circuit.

Still another object of the present invention is to provide a 8B6T coding circuit where 4 bits of transmit data is processed at a time.

To achieve these and other advantages and in accordance with the purpose of the present invention, as embodied and broadly described, the 8 bit 6 ternary (8B6T) coding circuit including first and second d type flip-flops for delay-outputting transmit data of 4 bits to be sampled either at an increasing edge or a decreasing edge after dividing transmit data of 8 bits into the transmit data of 4 bits, according to a diagram relating to physical coding sublayer (PCS) transmit for decoding or encoding the transmit date of 8 bits of local area network (LAN), and a 8B6T coder including 4 bit 3 ternary (4B3T) least significant bit (LSB) and 4B3T most significant bit (MSB) each generating LSB 3T and MSB 3T, respectively, among 6 ternary symbols of the transmit data of 4 bits sampled through the first and second d type flip-flops; and a data loading region for outputting the LSB 3T and the MSB 3T as 12 bit 6T symbol by means of the 8B6T coder.

The present invention may be achieved in a whole or in parts by a coding circuit for transmission of n-bit data word at a first prescribed clock cycle (t) as an m-ternary code word, comprising: a plurality of storage elements, each receiving a prescribed number of bits of the n-bit data word at a second prescribed clock cycle; and a plurality of coders, each coupled to a corresponding storage element to receive the prescribed number of bits, each coder generating a partial ternary code word corresponding to the prescribed number of bits, wherein the partial code of each coder is outputted to a bus line to form the m-ternary code word corresponding to the n-bit data word.

The present invention may be also achieved in a whole or in parts by a method of coding an n-bit data word at a first prescribed clock cycle (t) as m-ternary code word, the method comprising the steps of: sampling (n÷x) bits by each of (x) number of storage elements at a second prescribed clock cycle; and generating (m÷y) partial ternary code word by each of (y) number of coders, each coder being coupled to a corresponding storage element Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 3a and 3b are code tables of 100 BASE-T4 8B6T coding circuit.

DETAILED DESCRIPTION OF PREFERRED EMBODIMENTS

Generally, the coding circuit of the present invention converts n-bit binary data word at a prescribed clock cycle (t) into to an m-trit ternary code word, where n and m are integers and n≧m. The coding circuit includes an (x) number of storage elements or latches and a (y) number of coders, each storage element or latch receiving (m÷x) bits Ot the binary data word at a clock cycle of (t÷x). After a prescribed delay period, a corresponding storage element or latch outputs the sampled bits to a corresponding coder at an increasing or decreasing edge of the clock signal. Each coder codes the sampled bits to (m÷y) ternary code. The each of the coders outputs (m÷y) ternary code onto a corresponding signal line of a bus. Hence, the coding circuit outputs m-trit ternary code word onto the bus.

Figure 1:
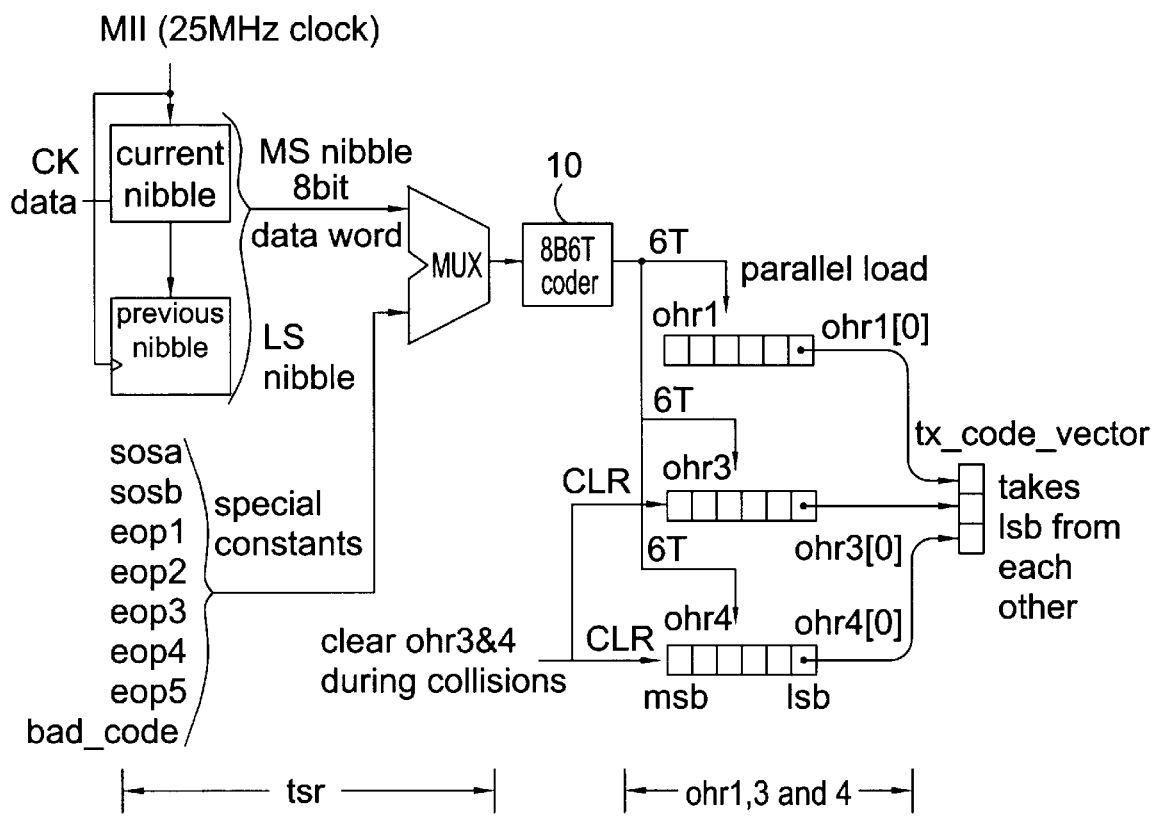
FIG. 1 is a block diagram for PSC transmit showing a related art 8B6T coding circuit.
Figure 1:
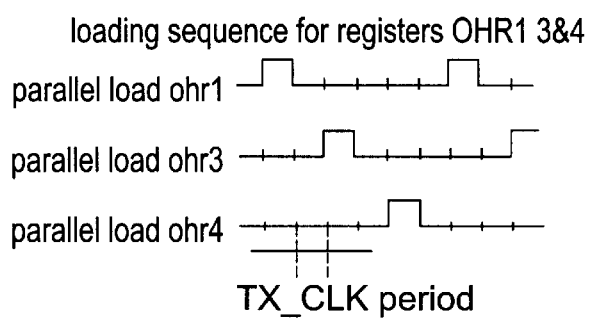
Figure 2:
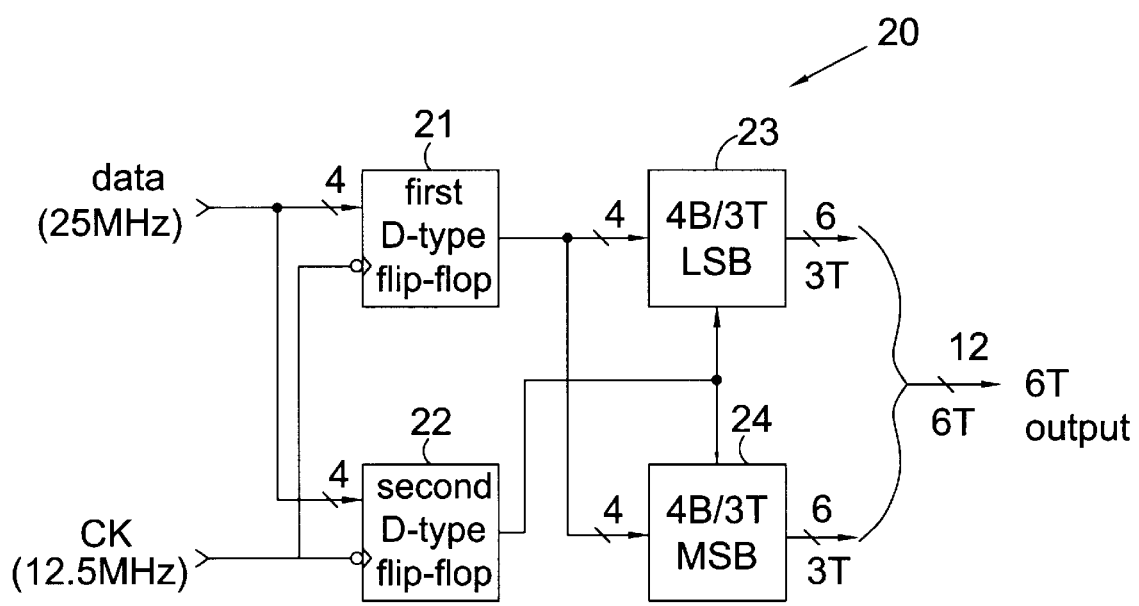
FIG. 2 is a detailed block diagram showing a 8B6T coding circuit according to a preferred embodiment of the invention.

FIG. 2 illustrates an example of a 8B6T coding circuit 20, e.g., where n=8 and m=6. The coding circuit 20 includes two D flip-flops 21 and 22 (serving as the storage element or latch) and two coders 23 and 24, e.g., where x=2 and y=2. Each of the D flipflops 21 and 22 receives 4 (8÷2) bits of the 8 bit binary data word at a clock cycle of t=25 MHz. FIGS. 3a and 3b illustrate the code tables of the 100 BASE-T4 8B6T coding circuit 20.

Each of the 4 bit transmit data of 25 MHZ provided by MII and an external clock signal of 12.5 MHZ (25÷2) into the first and second D type flip-flops 21 and 22, respectively. The first and second D type flip-flops 21 and 22 delay the 4 bit transmit data at an increasing edge or a decreasing edge of the external clock signal in sequence for sampling.

The our least significant bits (LSB) of the 8-bit code word is provided to the coder 23, and the four most significant bits MSB) or the 8-bit code word is provided to the coder 24. As shown, the transmit data of 25 MHZ is divided into LSB and LSB as 3T symbols and forms 4B/3T blocks. Then, output of each of the blocks is output as 6T symbols (see FIG. 2). Each coder outputs 6 bit 3T (ternary) symbols (code words). The LSB 3T and MSB 3T outputted by the 4B3T LSB and 4B3T MSB coders 23 and 24 are outputted as 12 bits 6T symbols or code words. In other words, as shown in FIGS. 3a and 3b of the code tables, each of the 6 ternary symbols is assigned by 2 bits, thus reproducing 12 bits of 6 bits. Each of the symbols represents one of the three constants such as +, 0, or −, and each bit has a logical value of 0 or 1.

FIGS. 3a and 3b show in sequence 100 BASE-T4 8B6T code table which satisfies 100 Mbps data-processing speed according to the 8B6T coding circuit of the invention. The 6T code words are loaded to output hold registers ohr1, ohr3, and ohr4 by 12 bits in parallel according to the 8B6T code table. At this time, since the second output hold register ohr2 corresponds to receive pairs, it is excluded from the loading step.

In the loading sequence, the registers ohr1, ohr3, and ohr4 are loaded in parallel according to TX_CLK period, and take on a LSB 1sb from each of the output hold registers, whereby they are transmitted to the PMA physical medium attachment) which is the data-processing step as tx-code vector. At this time, the clear signal (CLR) is an outer signal to clear the output hold registers ohr3 and ohr4 when there is a loading collision of the data.

A 8B6T coding circuit of the invention has various advantages. When data, which will be transmitted, is processed 8 bits at a time, as in the background art, 1262 gate levels are needed. When the data is process by 4 bits at a time of a preferred embodiment, only 447 gate levels are needed, thereby minimizing hardware size. Moreover, the data is processed by 4 bits in sequence as the data has been inputted, thereby obtaining operation stability of the coding circuit. The 8B6T coding circuit also processes more data in minimal time by means of change of clock frequencies.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A coding circuit for transmission of n-bit data word at a first prescribed clock cycle (t) as an m-ternary code word, comprising:

a plurality of storage elements, each receiving a prescribed number of bits of the n-bit data word at a second prescribed clock cycle; and a plurality of coders, each coupled to a corresponding storage element to receive the prescribed number of bits, each coder generating a partial ternary code word corresponding to the prescribed number of bits, wherein the partial code of each coder is outputted to a bus line to form the m-ternary code word corresponding to the n-bit data word.

2. The coding circuit of claim 1, wherein each storage element comprises a D flip-flop.

3. The coding circuit of claim 1, wherein there are (x) number of storage elements, each receiving a (n÷x) number of bits of the n-bit data word.

4. The coding circuit of claim 3, wherein said second prescribed clock cycle equals (t÷x).

5. The coding circuit of claim 3, there are (y) number of coders, each receiving (n÷x) number of bits to generate a partial ternary code word of (m÷y).

6. The coding circuit of claim 5, wherein x=y.

7. The coding circuit of claim 1, wherein n=8 and m=6.

8. The coding circuit of claim 7, wherein there are two storage elements, each receiving 4 bits of the 8-bit data word.

9. The coding circuit of claim 8, wherein there are two coders coupled to the two storage elements, respectively, each coder generating a 3-ternary partial code word.

10. A method of coding an n-bit data word at a first prescribed clock cycle (t) as m-ternary code word, the method comprising the steps of:

sampling (n÷x) bits by each of (x) number of storage elements at a second prescribed clock cycle; and generating (m÷y) partial ternary code word by each of (y) number of coders, each coder being coupled to a corresponding storage element.

11. The method of claim 10, wherein the second prescribed clock cycle equals (t÷x).

12. The method of claim 10, wherein n=8, m=6, x=2, y=2 and t=25 MHz.

* * * * *